(12) United States Patent
Lu (10) Patent No.: US 11,477,907 B2
(45) Date of Patent: Oct. 18, 2022

(54) SERVER CABINET ASSEMBLY

(71) Applicants: Inventec (Pudong) Technology Corporation, Shanghai (CN); INVENTEC CORPORATION, Taipei (TW)

(72) Inventor: Xiaogang Lu, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 94 days.

(21) Appl. No.: 17/208,111

(22) Filed: Mar. 22, 2021

(65) Prior Publication Data

US 2022/0256726 A1 Aug. 11, 2022

(30) Foreign Application Priority Data

Feb. 10, 2021 (CN) .......................... 202110185018.3

(51) Int. Cl.
  *H05K 7/00* (2006.01)
  *H05K 7/14* (2006.01)
  *H05K 5/02* (2006.01)

(52) U.S. Cl.
  CPC .......... *H05K 7/1489* (2013.01); *H05K 5/023* (2013.01); *H05K 5/0221* (2013.01)

(58) Field of Classification Search
  CPC .. H05K 7/1489; H05K 7/1488; H05K 7/1487; H05K 5/0221; H05K 5/023;
  (Continued)

(56) References Cited

U.S. PATENT DOCUMENTS

| 1,993,477 A | * | 3/1935 | Gourley | ................. | A47B 63/02 |
| | | | | | 312/301 |
| 2016/0014918 A1 | * | 1/2016 | Kelaher | ............... | H05K 7/1487 |
| | | | | | 312/319.1 |

(Continued)

FOREIGN PATENT DOCUMENTS

| CN | 109032285 | * 12/2018 |
| CN | 112068647 | * 12/2020 |

(Continued)

OTHER PUBLICATIONS

English translation of CN113238638 (Year: 2021).*
(Continued)

*Primary Examiner* — Janet M Wilkens
(74) *Attorney, Agent, or Firm* — Locke Lord LLP; Tim Tingkang Xia, Esq.

(57) ABSTRACT

A server cabinet assembly includes a tray, a carrier, and an angle adjustment mechanism. The carrier is pivotably disposed on the tray about a pivot axis, and the carrier is configured to accommodate a data storage device. The angle adjustment mechanism includes a positioning component, a handle, and a latch. The positioning component is disposed on the tray. The positioning component has a plurality of first positioning portions. The handle is disposed on the carrier. The latch is movably disposed on the carrier and located between the positioning component and the handle. The latch includes an operation portion and a second positioning portion connected to each other. The operation portion is movable toward the handle to move the second positioning portion away from the positioning component or is movable away from the handle to make the second positioning portion engage with one of the plurality of first positioning portions.

10 Claims, 10 Drawing Sheets

(58) Field of Classification Search
CPC . E05C 1/00; E05C 1/002; E05C 1/004; E05C 1/08; E05C 1/085; E05C 1/10; E05B 63/0008; Y10S 292/11; Y10S 292/17; G11B 33/128; G06F 1/187; G06F 1/181
USPC .................. 312/309, 223.1, 223.2, 333, 215
See application file for complete search history.

(56) References Cited

U.S. PATENT DOCUMENTS

| | | | | |
|---|---|---|---|---|
| 2017/0293325 | A1* | 10/2017 | Chen | G11B 33/128 |
| 2017/0347472 | A1* | 11/2017 | Yu | G11B 33/128 |
| 2017/0347481 | A1* | 11/2017 | Kuan | H05K 7/1487 |
| 2018/0157295 | A1* | 6/2018 | Zhu | H05K 5/023 |
| 2020/0396859 | A1* | 12/2020 | Liu | G11B 33/128 |
| 2021/0092861 | A1* | 3/2021 | Yu | H05K 7/1489 |
| 2021/0298193 | A1* | 9/2021 | Peng | H05K 7/1487 |
| 2021/0368645 | A1* | 11/2021 | Li | H05K 7/1487 |

FOREIGN PATENT DOCUMENTS

| | | | |
|---|---|---|---|
| CN | 113238638 | * | 8/2021 |
| TW | 1718682 | * | 2/2021 |
| WO | 2020015369 | * | 1/2020 |

OTHER PUBLICATIONS

English translation of TW1718682 (Year: 2021).*
English translation CN112068647 (Year: 2020).*
English translation of CN109032285 (Year: 2018).*
English translation of WO2020/015369 (Year: 2020).*

* cited by examiner

SERVER CABINET ASSEMBLY

CROSS-REFERENCE TO RELATED APPLICATIONS

This non-provisional application claims priority under 35 U.S.C. § 119(a) on Patent Application No(s). 202110185018.3 filed in China, P.R.C. on Feb. 10, 2021, the entire contents of which are hereby incorporated by reference.

BACKGROUND OF THE INVENTION

Technical Field of the Invention

The present disclosure relates to a sever cabinet assembly, more particularly to a server cabinet assembly including an angle adjustment mechanism.

Description of the Related Art

A server generally contains a certain number of hard disks to offer required services for a great number of users. Generally, the hard disks are physically housed in the server cabinet, and the hard disks are arranged in a compact manner in order to make the most of the internal space.

However, this arrangement of the hard disks makes the surrounding space becomes very limited, such that it is troublesome and inconvenient for user to install or remove the selected hard disk. Therefore, how to make it easy to install and remove hard disks of compact arrangement is an important topic in the field.

SUMMARY OF THE INVENTION

The present disclosure provides a sever cabinet assembly that allows convenient insertion and removal of a component therefrom.

According to one aspect of the present disclosure, a server cabinet assembly is configured to accommodate a data storage device. The server cabinet assembly includes a tray, a carrier, and an angle adjustment mechanism. The carrier is pivotably disposed on the tray about a pivot axis, and the carrier is configured to accommodate the data storage device. The angle adjustment mechanism includes a positioning component, a handle, and a latch. The positioning component is disposed on the tray, and the positioning component has a plurality of first positioning portions. The handle is disposed on the carrier. The latch is movably disposed on the carrier and located between the positioning component and the handle, and the latch includes an operation portion and a second positioning portion that are connected to each other. The operation portion is movable toward the handle to move the second positioning portion away from the positioning component or is movable away from the handle to make the second positioning portion engage with one of the plurality of first positioning portions of the positioning component.

According to the server cabinet assembly discussed above, by operating the angle adjustment mechanism, the carrier can be easily pivoted to an angle suitable for convenient insertion and removal of devices into or from the carrier.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
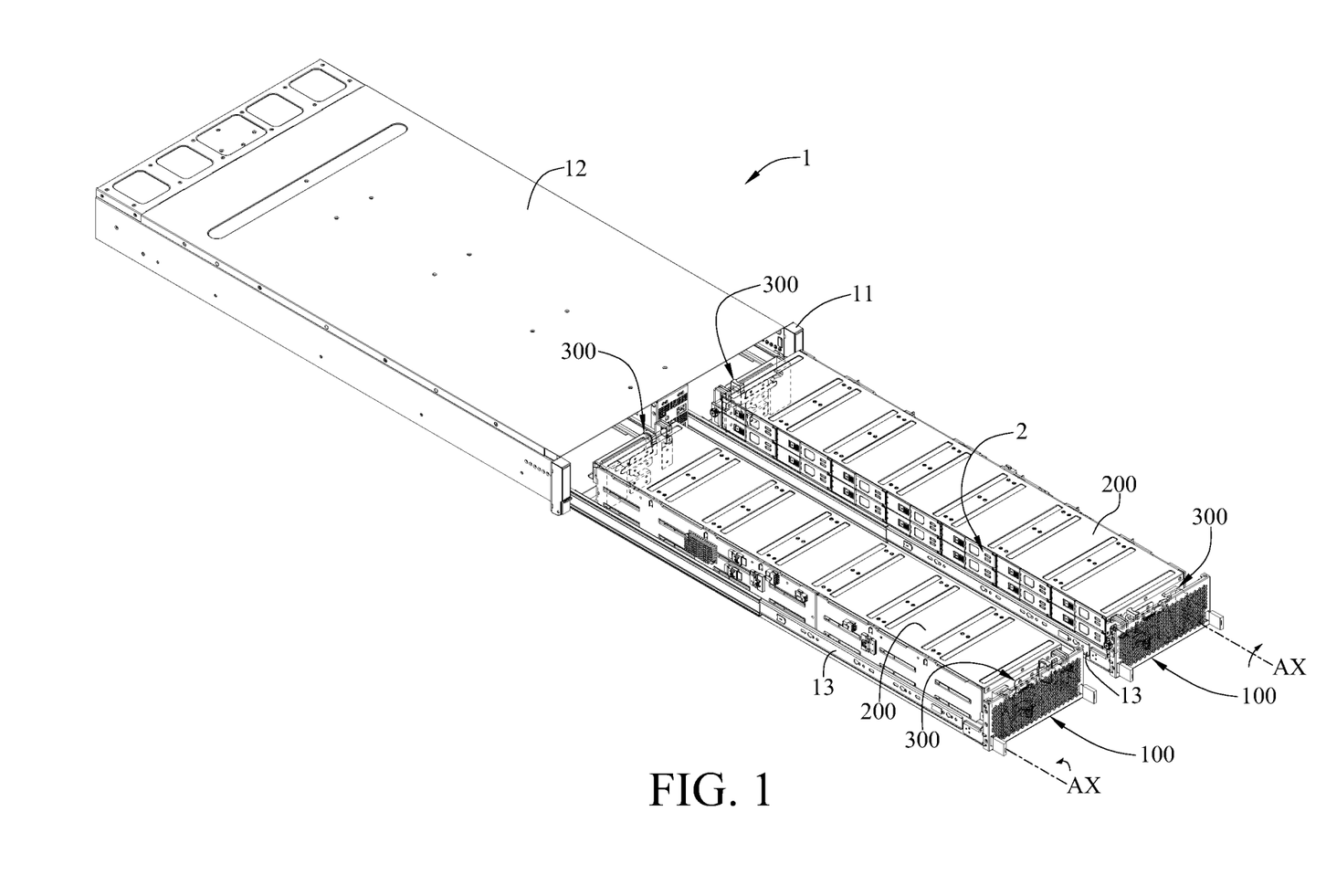
FIG. 1 is a perspective view of a server cabinet assembly according to one embodiment of the present disclosure and data storage devices.
Figure 2:
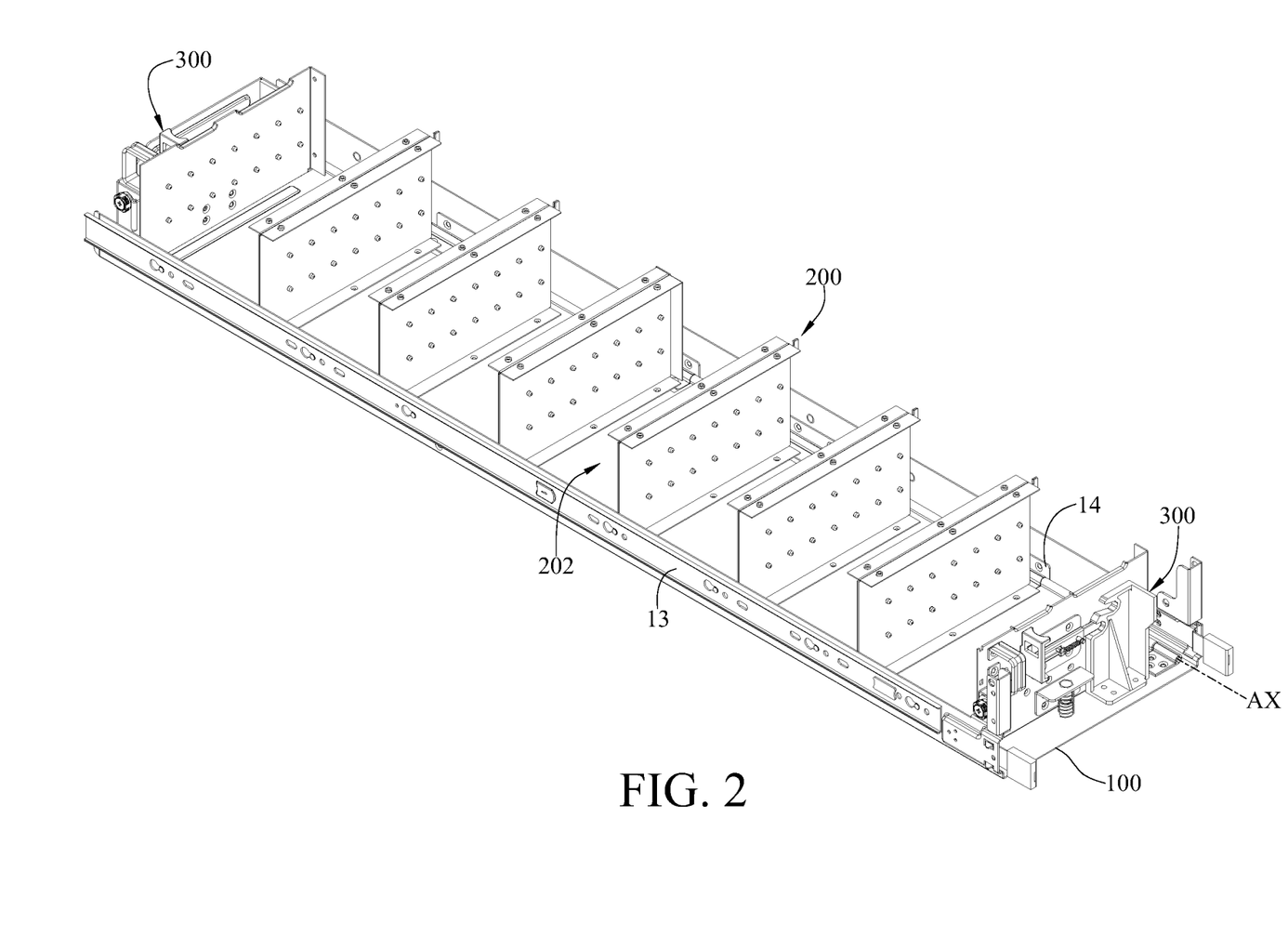
FIG. 2 is a partial view of the server cabinet assembly in FIG. 1.
Figure 3:
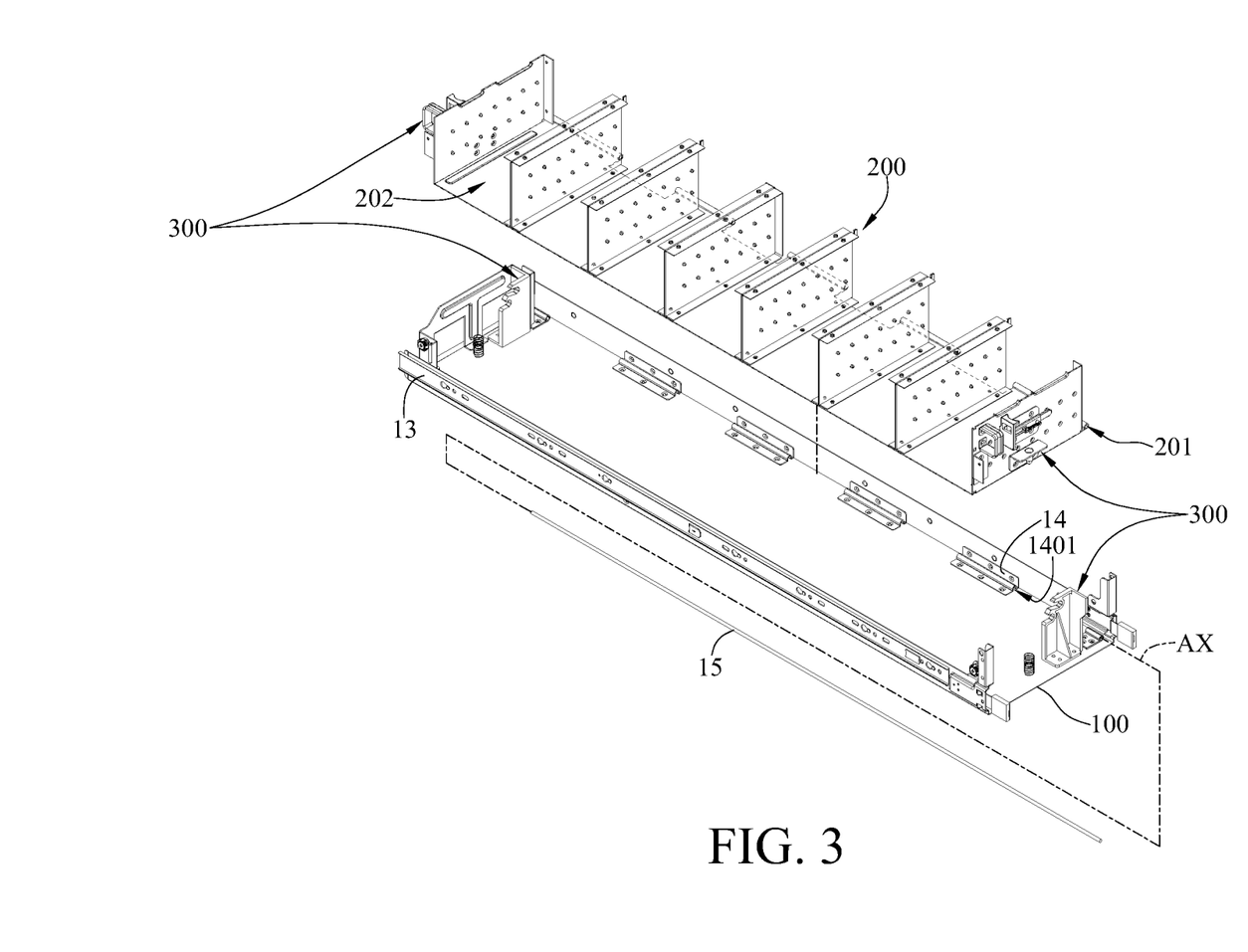
FIG. 3 is an exploded view of the server cabinet assembly in FIG. 2.
Figure 4:
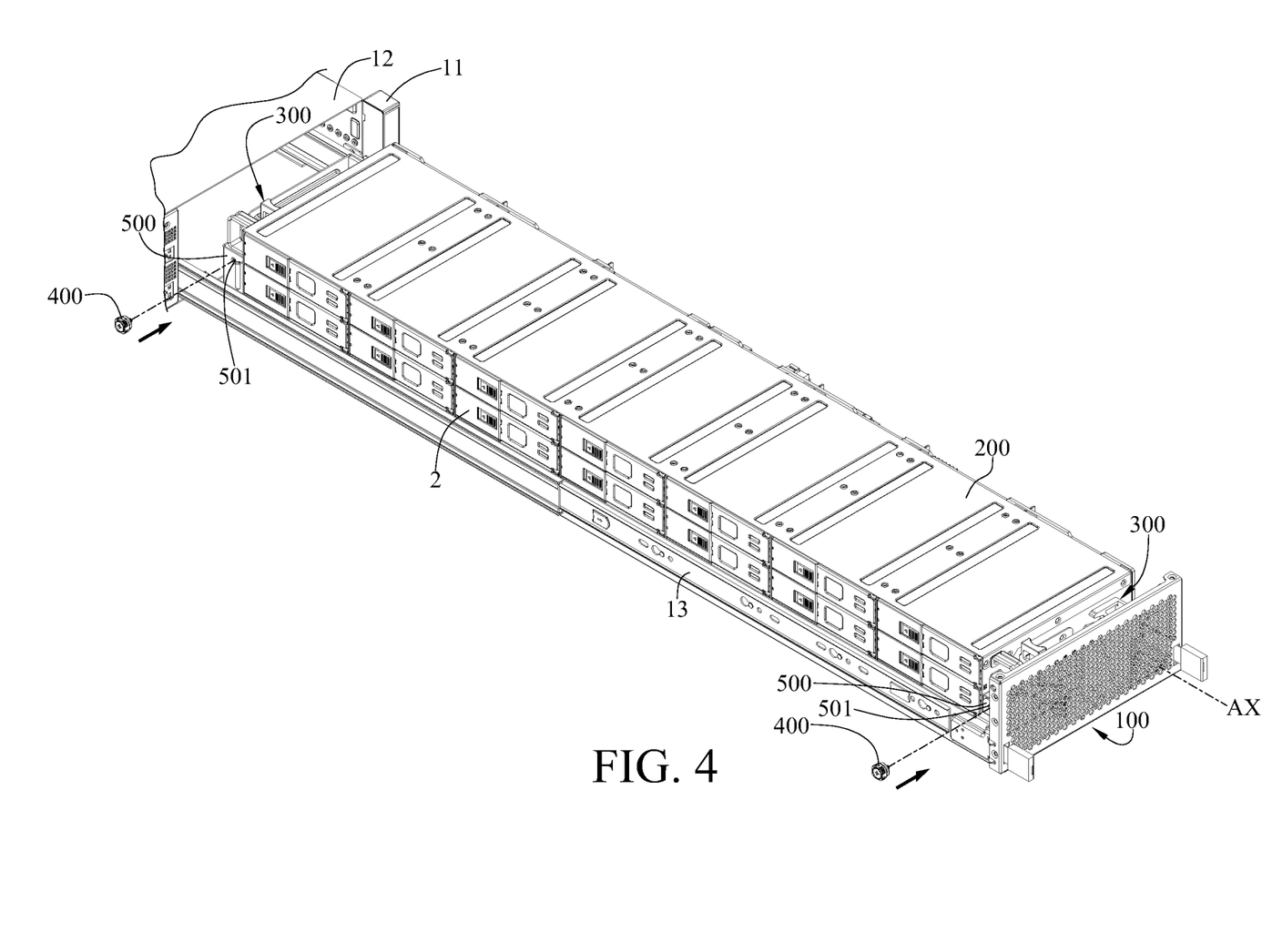
FIG. 4 is a partial view of the server cabinet assembly and the data storage devices in FIG. 1.
Figure 5:
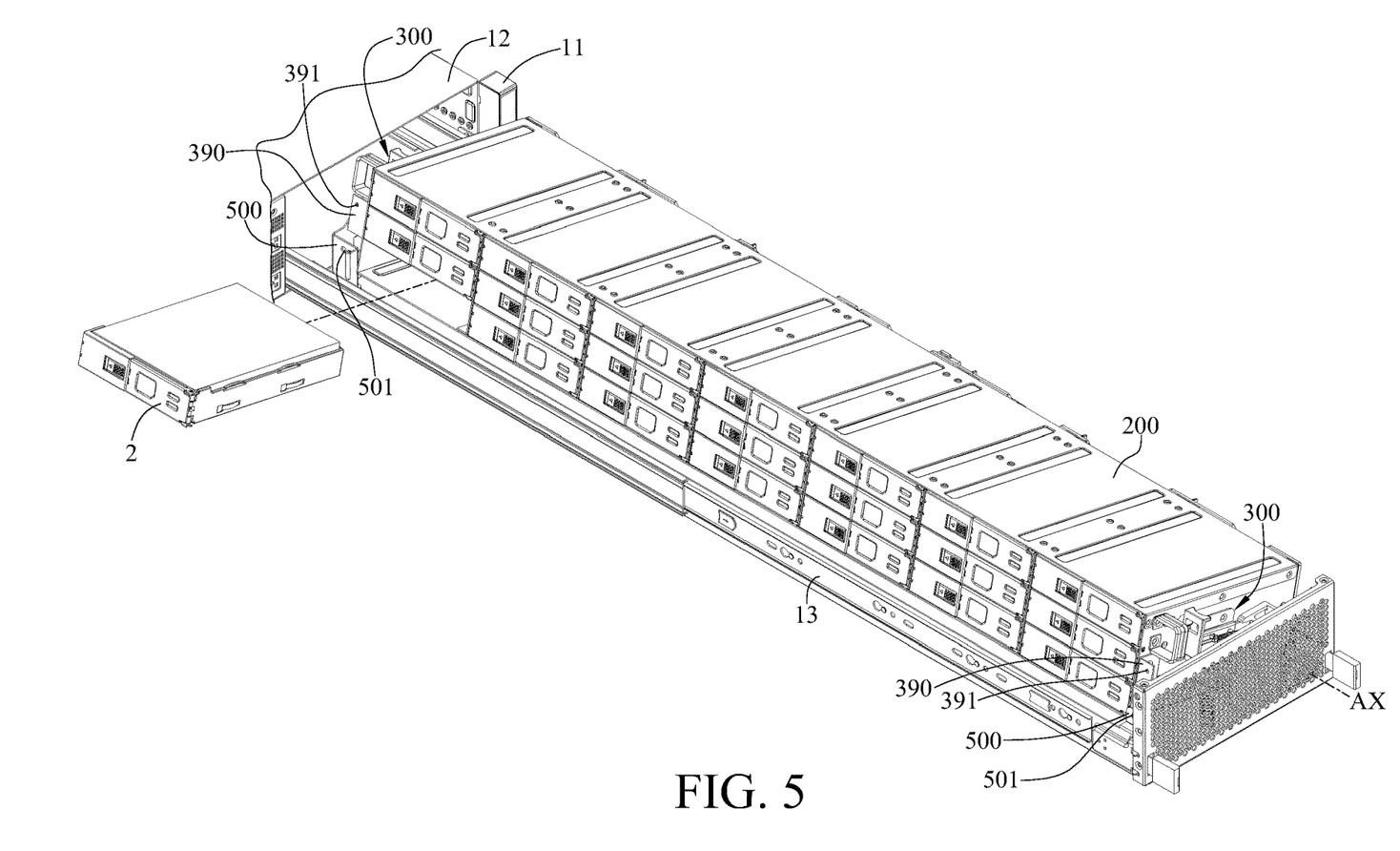
FIG. 5 is a perspective view of the server cabinet assembly and the data storage devices in FIG. 4 showing that a carrier of the server cabinet assembly is pivoted with respect to a tray.

Please refer to FIG. 1 to FIG. 5, where FIG. 1 is a perspective view of a server cabinet assembly according to one embodiment of the present disclosure and data storage devices, FIG. 2 is a partial view of the server cabinet assembly in FIG. 1, FIG. 3 is an exploded view of the server cabinet assembly in FIG. 2, FIG. 4 is a partial view of the server cabinet assembly and the data storage devices in FIG. 1, and FIG. 5 is a perspective view of the server cabinet assembly and the data storage devices in FIG. 4 showing that a carrier of the server cabinet assembly is pivoted with respect to a tray.

As shown, one embodiment provides a server cabinet assembly 1 configured to accommodate data storage devices 2 (also known as "hard disk"). In this and some embodiments of the present disclosure, the server cabinet assembly 1 includes a cabinet 11, a chassis 12, a plurality of slide rails 13, a plurality of metal pieces 14, two pivots 15, two trays 100, two carriers 200, and four angle adjustment mechanisms 300. Two slide rails 13, four metal pieces 14, one pivot 15, one tray 100, one carrier 200, and two angle adjustment mechanisms 300 form a data storage device accommodation assembly (not numbered), thus there are two data storage device accommodation assemblies in the server cabinet assembly 1. The data storage device accommodation assemblies are the same in configuration thus only one of them will be described in detail hereinafter.

In this and some embodiments of the present disclosure, the chassis 12 is disposed in the cabinet 11. The tray 100 is slidably disposed on the chassis 12 via the slide rails 13 so that the tray 100 can be received in or at least partially drawn out of the chassis 12.

In this embodiment, the carrier 200 is pivotably disposed on the tray 100 about a pivot axis AX. Specifically, in this and some embodiments of the present disclosure, the metal pieces 14 are disposed on the tray 100, and each metal piece 14 and the tray 100 form a pivot hole 1401 therebetween, the carrier 200 has a plurality of pivot holes 201 that are aligned with the pivot holes 1401 of the metal pieces 14, and the pivot 15 is disposed through the pivot holes 1401 and the pivot holes 201, such that the carrier 200 is pivotable with respect to the tray 100 about the pivot 15. The pivot 15 defines the pivot axis AX. The pivot axis AX and the slide rails 13 substantially extend in the same direction, that is, the pivot axis AX extends in a direction substantially parallel to the sliding direction of the tray 100 on the slide rails 13. In addition, the pivot 15 is disposed between the metal pieces 14 and the tray 100, such that the pivot 15 is not easily deformed due to sudden impact.

The carrier 200 has a plurality of openings 202 for the placements of the data storage devices 2 into the carrier 200. As shown, there are seven openings 202 and each of the openings 202 can accommodate one stack of three data storage devices 2. That is, each carrier 200 can accommodate 21 data storage devices 2 at most. Each carrier 200 is disposed between two angle adjustment mechanisms 300 being arranged along the slide rails 13. In other words, the angle adjustment mechanisms 300 and the carrier 200 are arranged along the slide rails 13. By operating the angle adjustment mechanisms 300, the carrier 200 can be pivoted to change the openings 202 to an angle that ensures that the bottom layer of data storage devices 2 will not be covered or blocked by the slide rails 13, the tray 100, or other components so as to make the insertion and removal of all data storage devices 2 convenient.

Each carrier 200 is pivotable so as to have a flat position and a tilted position. When the carrier 200 is in the flat position as shown in FIG. 4, the carrier 200 is placed flat on the tray 100; in other words, the bottom surface (not numbered) of the carrier 200 at this moment is substantially in parallel with the supporting surface (not numbered) of the tray 100, and the lower portion of each opening 202 is covered by the slide rail 13. On the other hand, when the carrier 200 is switched to the tilted position as shown in FIG. 5, the carrier 200 is tilted so that its bottom surface is at an angle to the tray 100 and its openings 202 are moved upwards to a place not covered by the slide rail 13.

Referring to FIG. 1, the sides of the carriers 200 having the openings 202 face each other, and the directions that the carriers 200 pivot to the tilted position are opposite. And the trays 100 are independent of each other and therefore it allows to draw out one tray 100 at a time. Thus, the user is allowed to operate the data storage devices 2 by standing in front of openings 202 of one of the trays 100.

For the purpose of simple illustration, only the operation of one of the angle adjustment mechanisms 300 will be described below. Please refer to FIG. 6 to FIG. 9, which are partially-enlarged side views of the server cabinet assembly in FIG. 1 to show the operation of the angle adjustment mechanism. In this embodiment, each angle adjustment mechanism 300 includes a positioning component 310, a handle 320, and a latch 330. The positioning component 310 is disposed on the tray 100, and the positioning component 310 has a plurality of first positioning portions 311. The first positioning portions 311 may be open grooves. The handle 320 is disposed on the carrier 200. The latch 330 is movably disposed on the carrier 200 and located between the positioning components 310 and the handles 320.

Specifically, in this and some embodiments of the present disclosure, the latch 330 includes an operation portion 331 and a second positioning portion 332 that are connected to each other, and the angle adjustment mechanism 300 can further include a guide component 340. The guide component 340 is disposed on the carrier 200 and located between the positioning component 310 and the handle 320. The guide component 340 has a guide groove 341. The second positioning portion 332 is disposed through the guide groove 341, such that the latch 330 is movable between the positioning component 310 and the handle 320 via the second positioning portion 332.

In this embodiment, the operation portion 331 is movable with respect to the carrier 200. The operation portion 331 can be moved toward the handle 320 to move the second positioning portions 332 away from the positioning component 310, allowing the carrier 200 to be pivotable with respect to the positioning component 310. On the other hand, the operation portion 331 can be moved away from the handle 320 to make the second positioning portion 332 engage with one of the first positioning portions 311 of the positioning component 310, holding the carrier 200 in an immovable state.

Specifically, the latch 330 has a released position and an engaged position. When the operation portion 331 moves toward the handle 320, and the second positioning portion 332 is not yet in contact with the positioning component 310, the latch 330 is in the released position. In this position, the operation portion 331 and the handle 320 are located close to each other and can be held in one hand, facilitating the user to pivot the carrier 200 and the data storage devices 2 therein about the pivot axis AX by hand to either the flat position or the tilted position.

The second positioning portion 332 is aligned with one of the first positioning portions 311 whether the carrier 200 is in the flat position or the tilted position, thus the operation portion 331 can be moved away from the handle 320 to make the second positioning portion 332 engage with one of the first positioning portions 311, thereby fixing the latch 330 in the engaged position. At this position, the carrier 200 and the data storage devices 2 cannot be pivoted with respect to the positioning component 310 and the tray 100, securing the electrical connection of the data storage devices 2. When the carrier 200 is switched to the tilted position while the latch 330 is kept in the engaged position, the data storage devices 2 are allowed to be inserted into or removed from the carrier 200.

In this embodiment, the insertion of the second positioning portion 332 into one first positioning portion 311 is exemplary, the quantity of the first positioning portions 311 are exemplary, and they are not intended to limit the present disclosure. In some embodiments, the second positioning portion may be engaged with one first positioning portion by hook, snap-fit, etc. In some other embodiments, the positioning component may have three or more first positioning portions.

In this embodiment, the angle adjustment mechanism 300 is to facilitate the pivot of the carrier 200 and to ensure that the openings 202 can be moved to a position not covered by the slide rails 13. However, the present disclosure is not limited thereto. In some other embodiments, the angle adjustment mechanism may be disposed only for facilitating the pivot of the carrier.

In this and some embodiments of the present disclosure, the quantities of the chassis 12, the slide rails 13, the metal pieces 14, the pivots 15, the trays 100, the carriers 200, and the angle adjustment mechanisms 300 are exemplary and not intended to limit the present disclosure.

Figure 10:
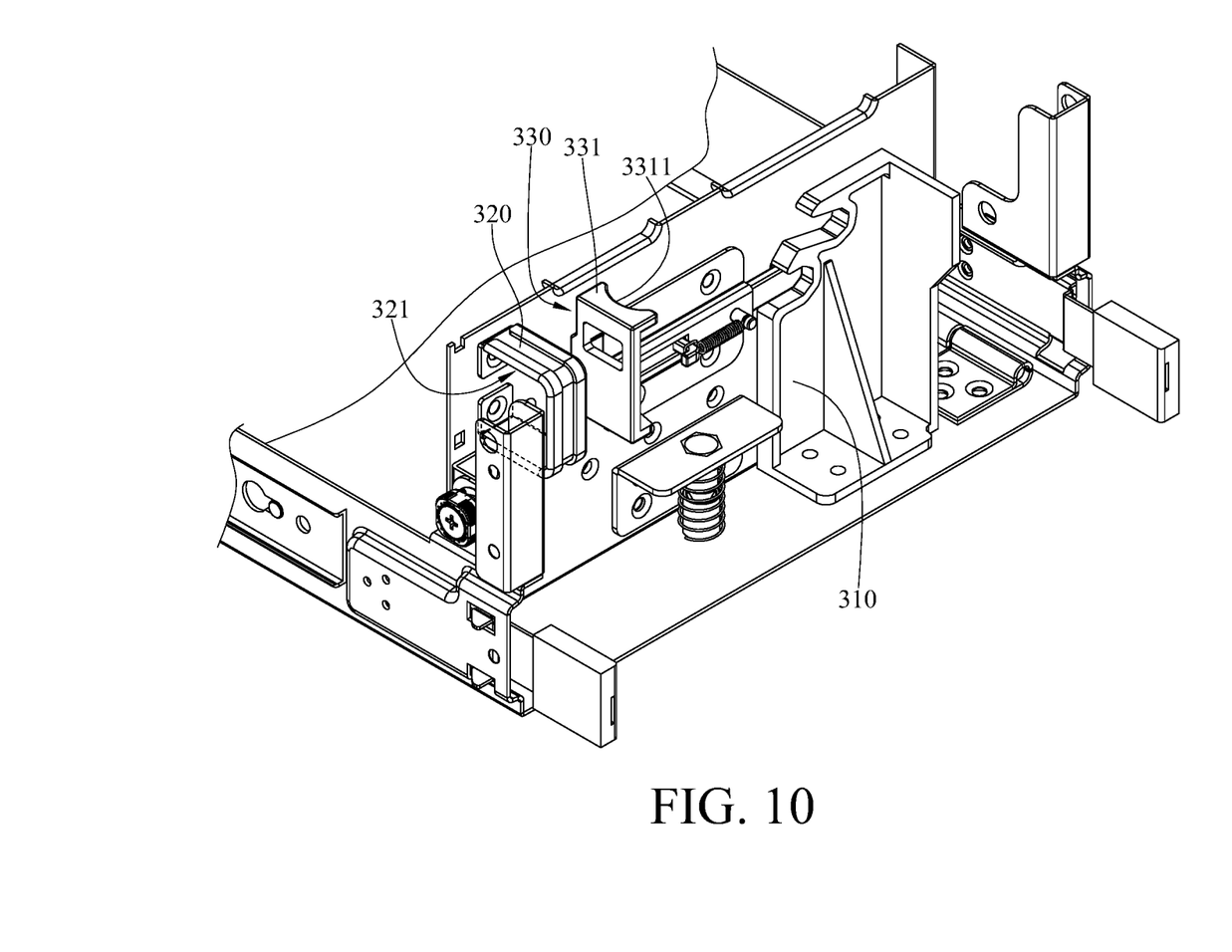
FIG. 10 is a partially enlarged view of the server cabinet assembly in FIG. 1.

Please refer to FIG. 10, which is a partially enlarged view of the server cabinet assembly in FIG. 1. As shown, in this and some embodiments of the present disclosure, the operation portion 331 of the latch 330 may have a curved surface 3311 facing the positioning component 310 and recessed toward the handle 320. The handle 320 is in a rectangular or circular shape having a through hole 321 that faces toward the latch 330. The shape of the curved surface 3311 is suitable for a finger to move the operation portion 331 while the size and shape of the through hole 321 are suitable for another finger to hold the handle 320.

Figure 6:
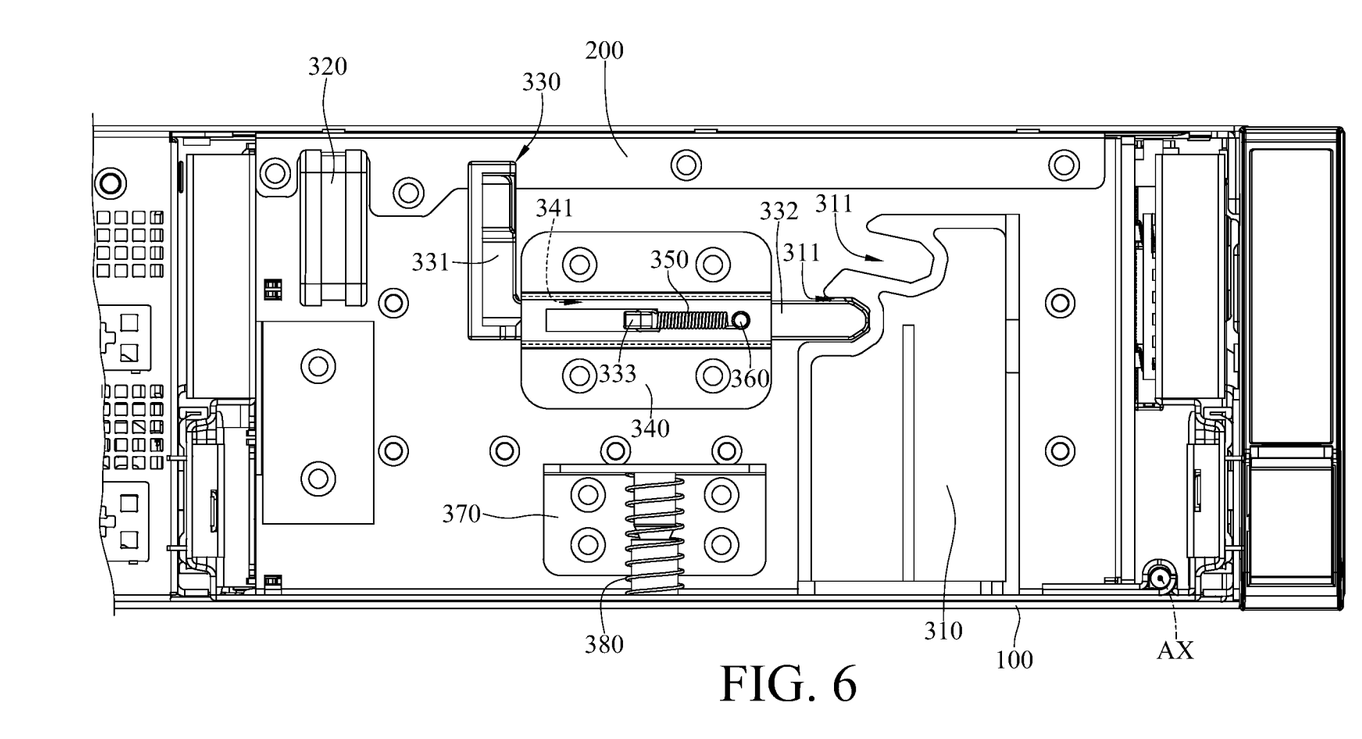
FIG. 6 to FIG. 9 are partially-enlarged side views of the server cabinet assembly in FIG. 1 to show the operation of an angle adjustment mechanism.
Figure 7:
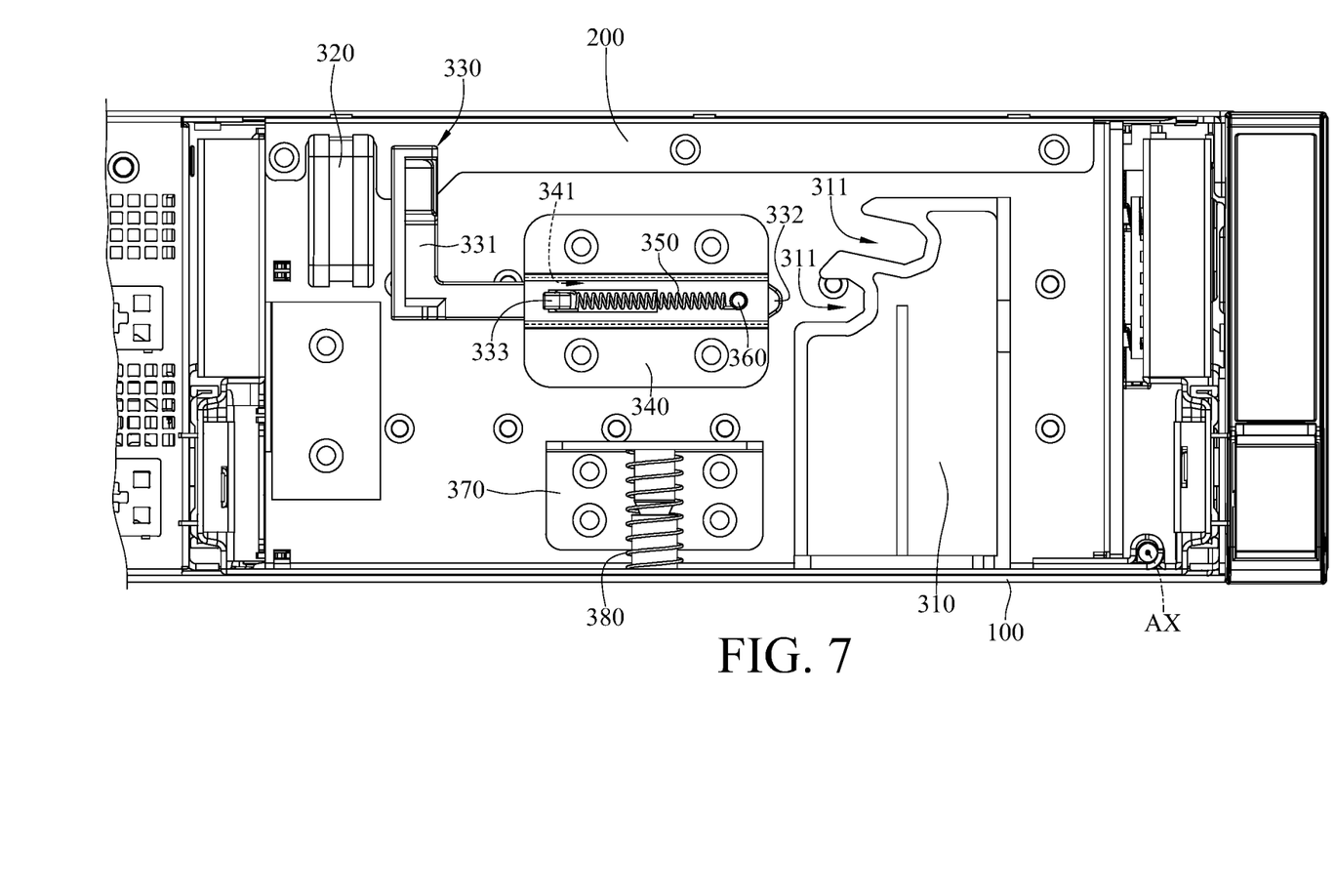
Figure 8:
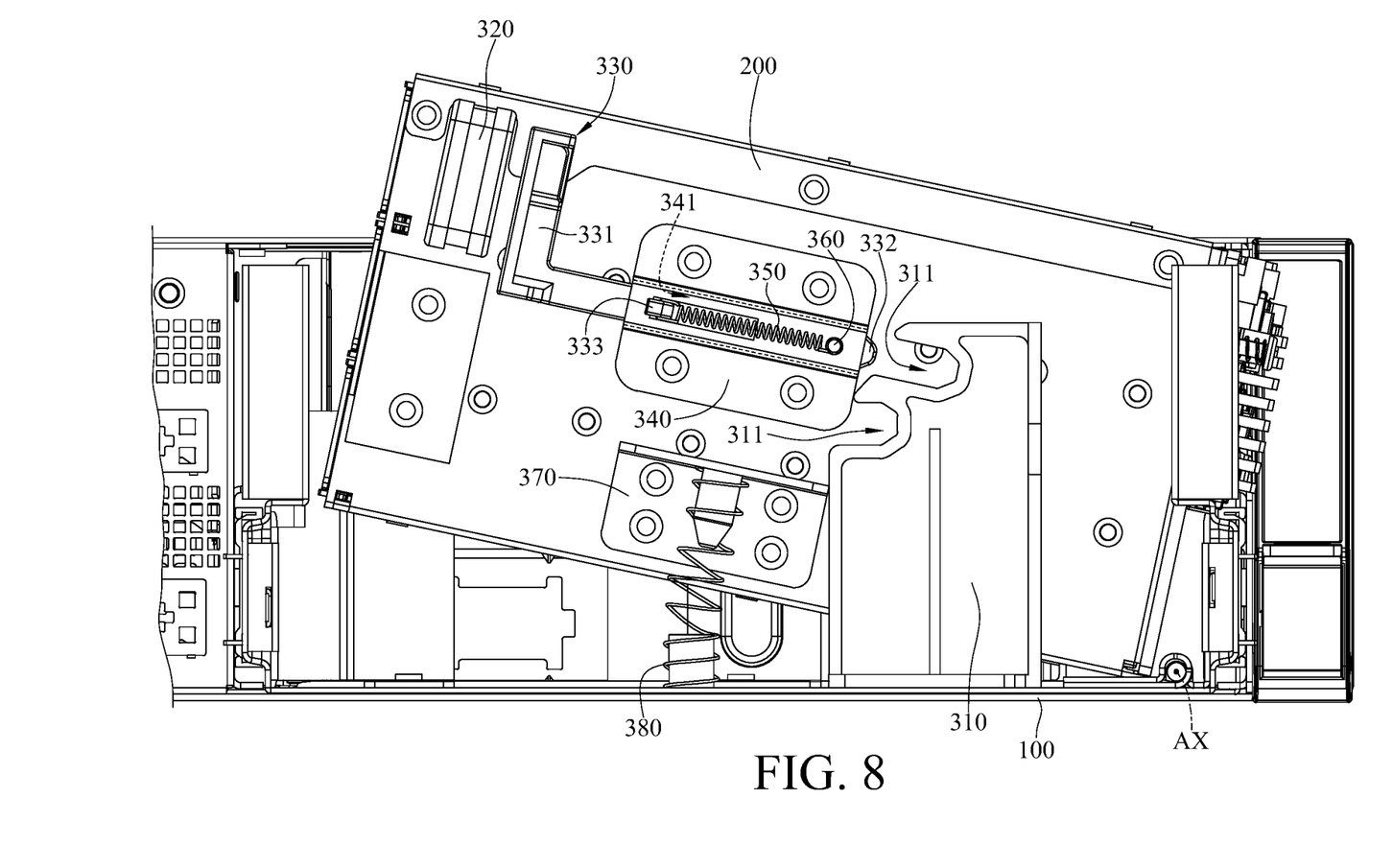
Figure 9:
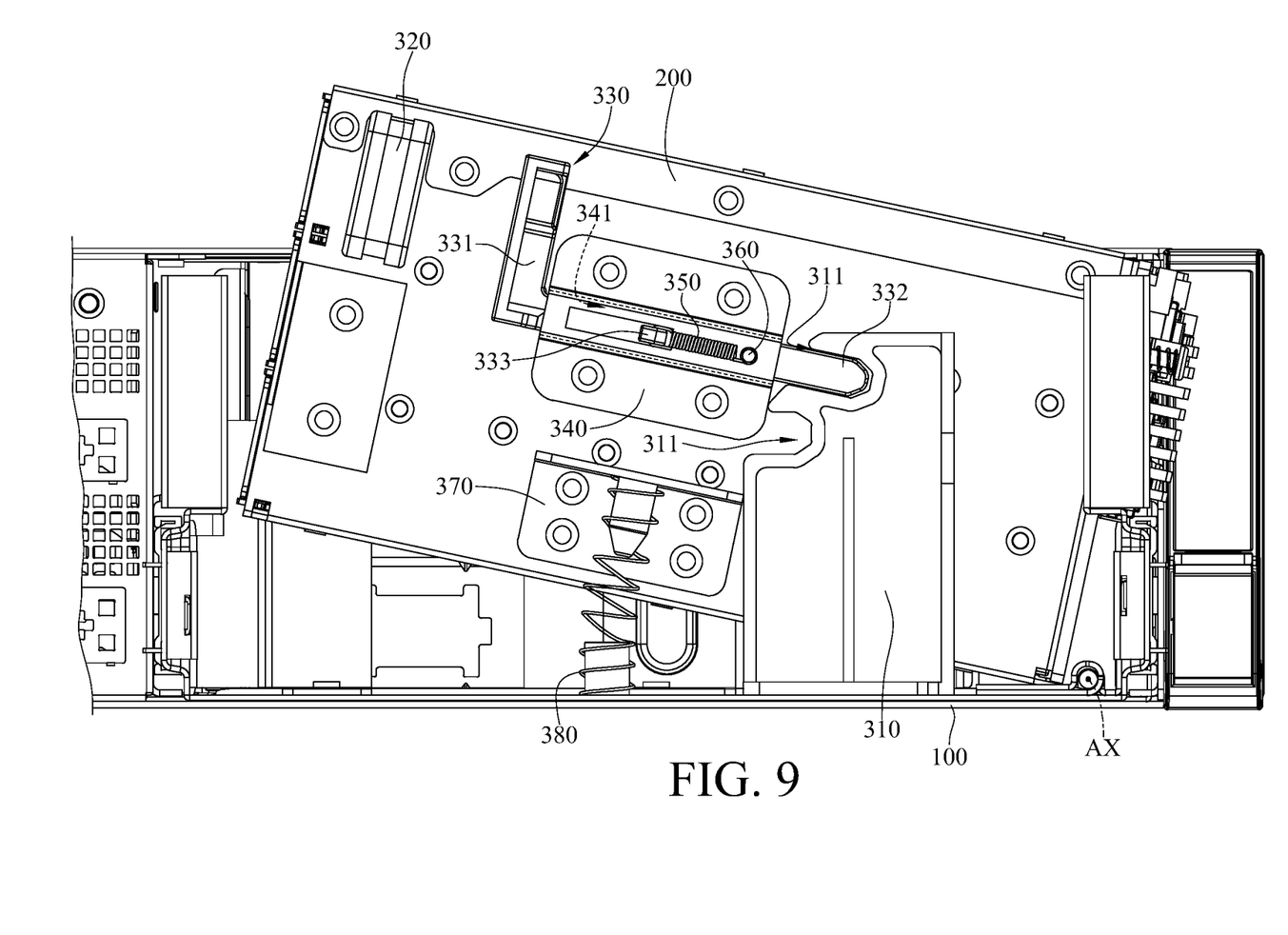

Please refer to FIG. 6 to FIG. 9 again. In this and some embodiments of the present disclosure, the angle adjustment mechanism 300 may further include an elastic component 350 and a first protrusion 360. The elastic component 350 may be an extension spring with hooks at two ends thereof. The first protrusion 360 is disposed on the guide component 340. The latch 330 may further include a second protrusion 333 disposed on the second positioning portion 332 and located between the first protrusion 360 and the handle 320. The first protrusion 360 and the second protrusion 333 are arranged in a direction substantially parallel to the guide groove 341. Two ends of the elastic component 350 are respectively hooked on the first protrusion 360 and the second protrusion 333. Therefore, when the latch 330 is moved to the released position, the elastic component 350 is extended; when the latch 330 is released, the elastic component 350 can automatically restore the latch 330 back to the engaged position.

In this and some embodiments of the present disclosure, the angle adjustment mechanism 300 may further include a block component 370 disposed on the carrier 200. When the carrier 200 is pivoted to the tilted position, the carrier 200 moves the block component 370 to abut the positioning component 310, preventing the carrier 200 from overly tilting. That is, the block component 370 can stops the carrier 200 at the tilted position. When the carrier 200 is not in the tilted position, the carrier moves the block component away from the positioning component.

In this and some embodiments of the present disclosure, the angle adjustment mechanism 300 may further include an elastic component 380 (e.g., compression spring) disposed between the tray 100 and the block component 370. As such, when the carrier 200 moves to the flat position from the tilted position, the elastic component 380 is compressed and provides cushion for the carrier 200, which reduces or absorbs the impact that the carrier 200 acts on the tray 100. And the elastic component 380 helps force the carrier 200 to move toward the tilted position.

Please refer to FIG. 4 and FIG. 5 again. In this and some embodiments of the present disclosure, the server cabinet assembly 1 may further include at least one fastener 400 and at least one first frame 500. The fastener 400 may be a thumb screw. The first frame 500 is disposed on the tray 100, and the first frame 500 has a first fastening hole 501. The angle adjustment mechanism 300 may further include a second frame 390 disposed on the carrier 200. The second frame 390 has a second fastening hole 391. The fastener 400 is disposed through the first fastening hole 501 and screwed on the internal thread of the second fastening holes 391 along a direction (denoted by arrows in FIG. 4). Accordingly, the fastener 400, the first frame 500, and the second frame 390 can provide another way to lock the carrier 200 from being pivotable with respect to the tray 100.

According to the server cabinet assembly discussed above, by operating the angle adjustment mechanism, the carrier can be easily pivoted to an angle suitable for convenient insertion and removal of devices into or from the carrier.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A server cabinet assembly, configured to accommodate a data storage device, the server cabinet assembly comprising:
   a tray;
   a carrier, pivotably disposed on the tray about a pivot axis, wherein the carrier is configured to accommodate the data storage device; and
   an angle adjustment mechanism, comprising:
      a positioning component, disposed on the tray, wherein the positioning component has a plurality of first positioning portions;
      a handle, disposed on the carrier; and
      a latch, movably disposed on the carrier and located between the positioning component and the handle, wherein the latch comprises an operation portion and a second positioning portion that are connected to each other; and the operation portion is movable toward the handle to move the second positioning portion away from the positioning component or is movable away from the handle to make the second positioning portion engage with one of the plurality of first positioning portions of the positioning component.

2. The server cabinet assembly according to claim 1, further comprising a cabinet, a chassis, and a slide rail, wherein the chassis is disposed in the cabinet, the tray is slidably disposed on the chassis via the slide rails, the pivot axis extends in a direction substantially parallel to a sliding direction of the tray on the slide rail, and the angle adjustment mechanism and the carrier are arranged along the slide rail.

3. The server cabinet assembly according to claim 1, wherein the operation portion of the latch has a curved surface facing the positioning component and recessed toward the handle, the handle is in a rectangular or circular shape having a through hole that faces toward the latch.

4. The server cabinet assembly according to claim 1, wherein the angle adjustment mechanism further comprises a guide component disposed on the carrier, the guide component has a guide groove, and the second positioning portion is disposed through the guide groove.

5. The server cabinet assembly according to claim 4, wherein the angle adjustment mechanism further comprises an elastic component and a first protrusion, the first protrusion is disposed on the guide component, the latch further comprises a second protrusion disposed on the second positioning portion and located between the first protrusion and the handle, the first protrusion and the second protrusion are arranged in a direction substantially parallel to the guide groove, and two ends of the elastic component are respectively disposed on the first protrusion and the second protrusion.

6. The server cabinet assembly according to claim 1, wherein the angle adjustment mechanism further comprises a block component disposed on the carrier, and the carrier is pivotable with respect to the positioning component to make the block component abut on the positioning component or move the block component away from the positioning component.

7. The server cabinet assembly according to claim 6, wherein the angle adjustment mechanism further comprises an elastic component disposed between the tray and the block component.

8. The server cabinet assembly according to claim 1, further comprising a fastener and a first frame, wherein the first frame is disposed on the tray, the first frame has a first fastening hole, the angle adjustment mechanism further comprises a second frame disposed on the carrier, the second frame has a second fastening hole, and the fastener is detachably inserted into the first fastening hole and the second fastening hole.

9. The server cabinet assembly according to claim 1, further comprising a metal piece and a pivot, wherein the metal piece is disposed on the tray, the metal piece and the tray form a pivot hole therebetween, the pivot is disposed through the pivot hole, the carrier is pivotable with respect to the tray about the pivot, and the pivot axis is defined by the pivot.

10. The server cabinet assembly according to claim 1, wherein a quantity of the tray is two, a quantity of the carrier is two, and directions that the carriers pivot are opposite.

\* \* \* \* \*